July 29, 1969 H. E. FERREE 3,458,776

CUSHIONING THRUST WASHER FOR APPLICATION OF UNIFORM
PRESSURE TO SEMICONDUCTOR IRREGULAR STRUCTURES

Filed Feb. 28, 1966

INVENTOR
Herbert E. Ferree
BY
C. L. Menzemer
ATTORNEY

United States Patent Office 3,458,776

Patented July 29, 1969

3,458,776

CUSHIONING THRUST WASHER FOR APPLICATION OF UNIFORM PRESSURE TO SEMICONDUCTOR IRREGULAR STRUCTURES

Herbert E. Ferree, Hempfield Township, Greensburg, Pa., assignor to Westinghouse Electric Corporation, Pittsburgh, Pa., a corporation of Pennsylvania Filed Feb. 28, 1966, Ser. No. 530,541
Int. Cl. H01l 1/02, 11/00
U.S. Cl. 317—234 5 Claims

ABSTRACT OF THE DISCLOSURE

A partially deformable thrust washer is employed in a compression bonded electrical device to distribute the required resilient force means uniformly over the entire surface to which the resilient force is applied. The thrust member is partially deformed by, and cooperates with, the means for applying the constant force to maintain the semiconductor element and the support member of the compression bonded electrical device in an electrically and thermally conductive relationship with each other.

This invention relates to a novel thrust member suitable for use in compression bonded electrical devices.

An object of the invention is to provide a compression bonded electrical device comprising a partially deformable thrust member which enables an applied force to be distributed uniformly over an irregular surface of a semiconductor element upon which the force is acting.

Other objects of the invention will, in part, be obvious and will, in part, appear hereinafter.

In order to more fully understand the nature and objects of the invention, reference should be had to the following description and accompanying drawings, in which.

Figures 3, 3A, 4:
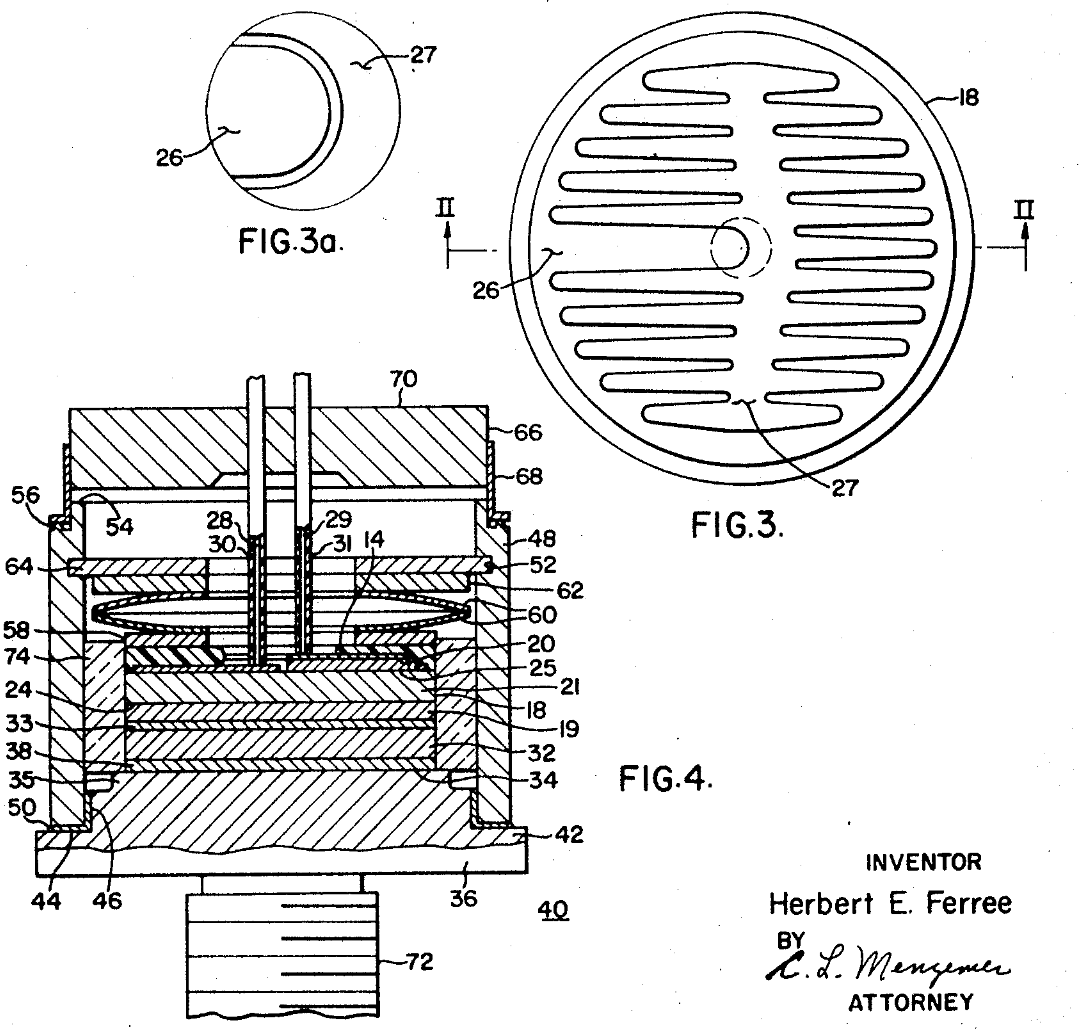
FIG. 3 is a top view of a semiconductor element.

FIG. 3*a* is an enlarged view of a portion of the element shown in FIG. 3; and

Figure 2:
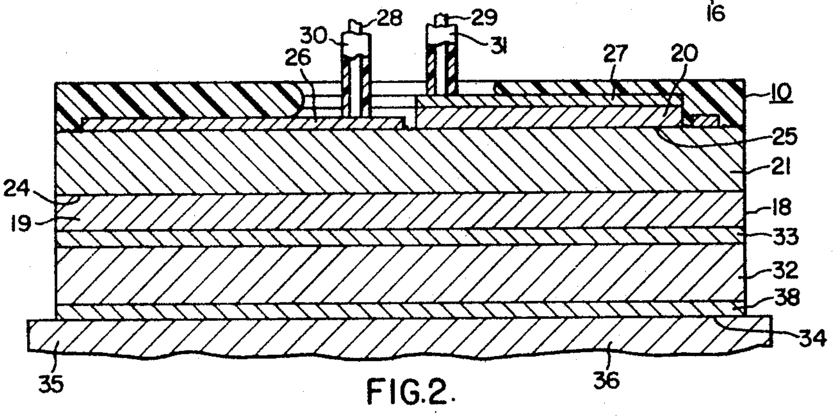
FIG. 2 is a side view, partially in cross-section, of a portion of a compression bonded electrical device employing the thrust member of FIG. 1.

FIG. 4 is a side view, partially in cross-section, of a compression bonded electrical device embodying the structural portion shown in FIG. 2.

In accordance with the present invention and in attainment of the foregoing objects, there is provided a compression bonded electrical device comprising an electrically and thermally conductive support member, a semiconductor element disposed on the support member and comprising a body of semiconductor material having at least two regions of semiconductivity and at least one semiconductivity transition region formed at the interface of the two regions of semiconductivity, a partially deformable thrust member disposed on the semiconductor element, and means for applying a constant force on the thrust member to maintain the semiconductor element and the support member in an electrical and thermal conductive relationship with each other.

To simplify the description of the invention, and for no other purpose, the invention will be described in terms of a compression bonded electrical device in which a semiconductor element has two electrical leads connected to the same surface of the element.

Figure 1:
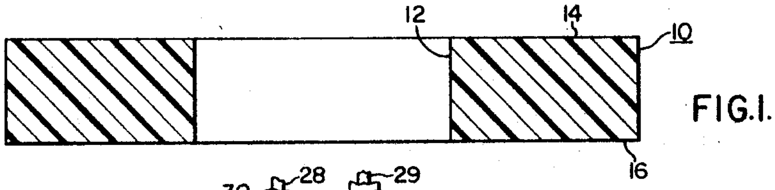
FIGURE 1 is a side view, partially in cross-section, of an apertured thrust member used in accordance with the teachings of this invention.

With reference to FIG. 1 there is shown a thrust member 10, suitable for use in a compression bonded electrical device in accordance with the teachings of this invention.

The member 10 has a top surface 14 and a bottom surface 16 and an axially disposed aperture 12 extending between surface 14 and surface 16. The member 10 consists of a material which can be partially deformed to match or compensate for any unevenness in a surface which comes in contact with the surfaces 14 and 16 of thrust member 10.

The material of the member 10 has physical properties which allow it to cold flow under pressure. The cold flow proceeds only to a given limit and then essentially ceases, whereupon the member 10 acts as a rigid member. Upon assuming the property of a rigid member, the material of the member 10 continually transmits any force applied to either surface 14 or 16 without any further appreciable cold flowing occurring. During operation of a compression bonded electrical device at a temperature level as high as 200° C. to 250° C., but preferably lower, and a pressure preferably exceeding 800 pounds per sqaure inch, the allowable further deformation of the member 10 must be as little as possible in order to protect the functional reliability of the electrical device.

Preferred materials having these desired properties are polytetrafluoroethylene and trifluoromonochloroethylene. These two materials in addition to having the desired properties, also are good electrically insulating materials for utilization in compression bonded electrical devices with operating temperatures up to approximately 250° C.

With reference to FIG. 2, there is shown the thrust member 10 disposed on a semiconductor element 18.

The semiconductor element 18 comprises a body of a semiconductor material selected from the group consisting of silicon, silicon carbide, germanium, compounds of Group III and Group V elements and compounds of Group II and Group VI elements. The element 18 has two regions 19 and 20 of a first type semiconductivity and one region 21 of a second type semiconductivity, a semiconductor transition region 24 between regions 19 and 21 and a semiconductor transition region 25 between regions 20 and 21.

A first electrical contact 26 is disposed on the element 18 in an electrically conductive relationship with the region 21 of second type semiconductivity. A second electrical contact 27 is disposed on the same surface of the element 18 as the contact 26 and in an electrically conductive relationship with the region 20 of first type semiconductivity.

With reference to FIG. 3 there is shown a top view of the semiconductor element 18 detailing the relationship of the electrical contacts 26 and 27 with each other.

FIG. 3*a* is an enlarged fragmentary view of a portion of the electrical contacts 26 and 27 shown in FIG. 3. In this enlarged view one can readily see the gap between the contacts 26 and 27 which electrically isolates the contacts 26 and 27 from each other. The surface which shows in the gap is the exposed surface of region 21 of second type semiconductivity.

Referring again to FIG. 2, a first electrical conductor 28 is connected to the contact 26. A second electrical lead 29 is connected to the contact 27. Each of the electrical conductors 28 and 29 are each joined to the respective contacts 26 and 27 by suitable means known to those skilled in the art, such, for example, as by ultrasonic welding. Suitable insulating members 30 and 31 comprising electrically insulating material such, for example, as either fluorocarbon, an electrically insulating rubber or an electrically insulating phenolic fibre, are disposed about the conductors 28 and 29 from each other.

The semiconductor element 18 has a third electrical contact 32 affixed thereto. The contact 32 is a firm supporting structure for the semiconductor element 18. The contact 32 has good electrical and thermal conductivity properties, and a thermal expansion characteristic closely matched to the semiconductor element 18. The joining of the semiconductor element 18 to the contact 32 may utilize a layer 33 of any suitable "hard" or "soft" solder known to those skilled in the art.

The solder layer 33 comprises a suitable solder such, for example, as a silver alloy, a gold-tin alloy, a silver-lead antimony alloy or a gold-germanium alloy having a melting point above 350° C. and having a greater strength and hardness than the more common alloys of lead and tin. This type of solder is known to those skilled in the art as a "hard" solder. A solder having a melting point below about 350° C., and known to those skilled in the art as a "soft" solder, may also be used. Such "soft" solders are usually, but need not be, lead-tin alloy solders.

It will be understood, of course, that the particular type of solder will depend on the anticipated operating temperature range of the element 18 as well as the particular ohmic contact requirements of the semiconductor element 18.

The third electrical contact 32 is separated from an uppermost mounting surface 34 of an upwardly extending pedestal portion 35 of a support member 36 of a compression bonded electrical device by a non-reactive, malleable, electrically and thermally conductive layer 38. The layer 38 compensates for any surface irregularities which may occur on the surface 34. The layer 38 may be deposited upon the surface 34 by any suitable means known to those skilled in the art, such, for example, as electrodeposition means, or as a preformed disc of a suitable metal affixed to the surface 34 and then contoured to specific requirements.

It is important that the surfaces between the third electrical contact 32 and the layer 48 be flat and planar so that no uneven pressures develop when compressed together.

With reference to FIG. 4, there is shown a compression bonded electrical device 40 utilizing the thrust member 10 shown in FIG. 1 made in accordance with the teachings of this invention and the structural arrangement shown in FIG. 2. The device 40 comprises the electrically and thermally conductive support member 36. The support member 36 is comprised of a peripheral flange 42 and the upwardly extending pedestal portion 35 having the uppermost mounting surface 34. The peripheral flange 42 has a top surface 44 and the upwardly extending pedestal portion 35 has a peripheral side surface 46.

An upwardly extending hollow cylindrical member 48 is affixed to the support member 36. The inner periphery of the member 48 conforms to the peripheral surface 46 of the pedestal portion 35.

The member 48 is affixed to the support member 36 by any suitable means known to those skilled in the art, such, for example, as by disposing a suitable braze material 50 between the top surface 44 of the flange 42 and the peripheral surface 46 of the pedestal portion 35 and a portion of the inner periphery and the bottom of the cylindrical member 48.

An annular groove 52, formed in the wall of the inner periphery of the cylindrical member 48, is located remote from the end joined to the support member 36. An upwardly extending integral flange 54 is formed about the upper end of the inner periphery. An annular integral weld ring 56 is formed in the upper surface of the member 48.

An apertured thrust washer 58 is disposed about the electrical conductors 28 and 29 and upon the top surface 14 of the thrust member 10. The washer 58 is comprised of a suitable metal or ceramic material.

At least one apertured spring washer 60 is disposed about the electrical conductors 28 and 29 and upon the top surface of the apertured thrust washer 58. An apertured metal thrust washer 62 is disposed about the electrical conductors 28 and 29 and upon the apertured spring washer 60.

An apertured expandable metal retaining ring 64, similar to a snap ring, is disposed about the electrical conductors 28 and 29, and within, and is retained by, the groove 52 formed in the inner periphery of the upwardly extending cylindrical member 48. The ring 64, cooperating with the cylindrical member 48 and the metal thrust washer 62, resiliently urges the apertured spring washer 60 to transmit a compression force through the apertured thrust washer 58 and thence through the apertured electrically insulating thrust member 10 to force the semiconductor element 18, the third electrical contact 32, and the uppermost mounting surface 34 of the upwardly extending pedestal portion 35 of the support member 36 into a good, firm, intimate, electrically and thermally conductive relationship with each other. More than one apertured spring washer 60 of the same or different thickness may be required to cooperate with the retaining ring 64, the metal thrust washer 62 and the cylindrical member 48 to establish the necessary compressional force required for a reliable operating device 40.

The device 40 is completed by providing a hermetic enclosure for the semiconductor element 18. This hermetic enclosure is formed by affixing an apertured header assembly 66 to the member 48. The header assembly 66 comprises an outwardly extended flange member 68 affixed to an apertured insulating seal member 70.

The header assembly 66 is joined to the member 48 by welding the outwardly extended flanged member 68 to the annular weld ring 56. The integral flange 54 acts as a guide for positioning the header assembly 66 during assembling and joining operations.

An electrical contact and thermal dissipating stud 72 is either affixed to or is integral with the support member 36. The stud 72 is used to connect the support member 36 to an electrical conductor and heat sink.

The device 40, as illustrated, has an apertured molecular sieve 74 disposed on an outer peripheral portion of the uppermost mounting surface 34 of the upwardly extending pedestal portion 35 of the support member 36. The molecular sieve 74 has an outer periphery conforming to the inner perphery of the upwardly extending cylindrical member 48. The inner periphery of the molecular sieve 74 conforms to the side surface of the non-reactive, malleable, electrically and thermally conductive layer 38. The inner periphery of the molecular sieve 74 facilitates the assembly of the device 40 by providing a means for self-centering the semiconductor element 18, the contact 32, the thrust member 10 and the thrust washer 58.

Although not required, the sieve 74 is desirable since it provides a means for restricting the lateral displacement of the member 10 when under the operational loading requirements for the device 40. The sieve 74 also functions as a moisture gattering device.

An alternative location for the molecular sieve 74 is to dispose the sieve 74 on top of the apertured expandable metal retaining ring 64. The sieve 74 would then be located between the seal member 70 and the ring 64. Self-centering of device components is then accomplished by enlarging the diameters of the semiconductor element 18, the contact 32, the apertured insulating thrust member 10 and the apertured thrust washer 58. Enlarging the diameter of these components permits the outer peripheral edges of the components to conform to the inner peripheral surface wall of the member 48.

The following example is illustrative of the teachings of this invention:

A good electrically and thermally conductive support member having an integral electrical contact and thermal dissipating stud was prepared from a piece of copper alloy bar stock. The finished machined configuration was the same as illustrated in FIG. 3. A layer of silver was then affixed to the uppermost mounting surface of the pedestal portion and machined to a specific flatness and diameter.

A ferrous integral case and weld ring assembly was then affixed to the support member by disposing a layer of braze material between portions of the assembly and the top of the peripheral flange and the side surface of the upwardly extending pedestal portion.

A silicon semiconductor transistor element suitable for use in a compression bonded electrical device was prepared. The element had a top surface which had been divided into two separate distinct regions of semiconductivity. The electrical contact to one semiconductivity region was 0.5 mil higher than the electrical contact to the other region of semiconductivity. A silver electrical lead was ultrasonically welded to each of the two electrical contacts.

The semiconductor element was affixed to a molybdenum electrical contact by disposing a layer of a silver-lead-antimony alloy electrical solder material between the bottom surface of the element and the top surface of the contact. The element and contact, affixed to each other, was then disposed within the integral case and weld ring assembly and upon the layer of silver on the pedestal.

An apertured polytetrafluoroethylene thrust member, 15 mils in thickness, was disposed about the electrical conductors on the semiconductor element and a portion of each of the electrical contacts within the apertured molecular sieve. The outer periphery of the thrust member conformed to the inner periphery of the integral case and weld ring assembly.

A first steel apertured thrust washer was then disposed about the electrical conductors from the element and on top of the polytetrafluoroethylene thrust member. The outer periphery of the thrust washer conformed to the inner periphery of the integral case and weld ring assembly. Two apertured steel spring washers and a second steel thrust washer were respectively disposed about the electrical conductors from the element and on top of the first steel thrust washer. The outer periphery of the spring washers and second steel thrust washer conformed to the inner periphery of the integral case and weld ring assembly.

Force was then applied to the second steel thrust washer and a steel retaining ring was snapped into an annular groove in the integral case and weld ring assembly to keep the spring washers in compression. The theoretical pressure on the surface of the element was in excess of 800 p.s.i. based on an absolutely smooth surface. After one hour, the retaining ring was removed and the device was unloaded.

Examination of the polytetrafluoroethylene thrust member revealed that the washer had cold flowed under pressure and molded itself about the irregularities in the surface of and portions of the electrical contacts on, the element. An outline of the structure of the element was clearly impressed in the surface of the member. The semiconductor element, upon visual inspection, was still structurally satisfactory.

The device was reloaded except for a hermetic seal. The calculated pressure on the theoretically smooth surface area of the element was approximately 1020 p.s.i. The device was heated to a temperature of approximately 200° C. for a period of 68 hours. The device was then cooled, the retaining ring removed and the polytetrafluoroethylene thrust member removed for an examination.

The thrust member had been permanently deformed about 10%. The outline of the semiconductor element's surface and portions of the electrical contacts attached thereto was clearly embossed in the surface of the thrust member. Visual examination of the semiconductor element showed no defects.

The device was reloaded again except for a hermetic seal. A new polytetrafluoroethylene thrust member was substituted for the permanently deformed thrust member previously used. The pressure applied to the semiconductor element surface was a calculated 1400 p.s.i. The device was heated to a temperature or 200° C. and held at temperature for approximately two hours. The device was then cooled, the retaining ring removed and the polytetrafluoroethylene thrust member removed for examination.

The thrust member had been permanently deformed approximately 10%. The structure of the semiconductor element and portions of the electrical contacts attached thereto was again clearly embossed in the surface of the thrust member. Visual examination of the semiconductor element still revealed no damage to the element.

Employing a new polytetrafluoroethylene thrust member, 15 mils in thickness, the device was again reassembled. A calculated pressure of 1000 p.s.i. was impressed on the surface of the semiconductor element. An apertured molecular sieve was disposed about electrical leads connected to the electrical contacts affixed to the semiconductor element and on the steel retaining ring. The hermetic enclosure shown in FIG. 3 was attached to the integral case and weld ring assembly to form a complete electrical device within which the semiconductor element was hermetically sealed.

The hermetically sealed electrical device was then electrically cycled through a theoretically operating cycle, typical of what the device would encounter during normal usage. The device continually performed satisfactorily and well within its design limits.

The device was carefully disassembled and the polytetrafluoroethylene thrust member was examined. The thrust member had been permanently deformed about 10%. A visual examination of the semiconductor element showed the element to be still in satisfactory condition.

Equally satisfactory test results were realized employing a trifluoromonochloroethylene thrust member.

The overall results clearly show that tetrafluoroethylene and trifluoromonochloroethylene are materials which can be used to make a suitable thrust member for distributing the required working force of a compression bonded device uniformly over the entire surface of that portion of a semiconductor element which comes into contact with the thrust member. Although subjected to elevated temperatures as well as room temperature, the material attains a permanent deformation of only approximately 10%. The material molds itself about the surface irregularities of the semiconductor element and thereby achieves a uniform pressure distribution over the entire semiconductor element surface with which the member is in a pressure contact relationship.

While the invention has been described with reference to particular embodiments and examples, it will be understood, of course, that modifications, substitutions aand the like may be made therein without departing from its scope.

I claim as my invention:

1. A compression bonded electrical device comprising (1) an electrically and thermally conductive support member, (2) a semiconductor element disposed on the support member, the element being comprised of a body of semiconductor material having at least two regions of opposite type semiconductivity and a p-n junction between the regions, (3) at least one electrical contact on said body extending upwardly therefrom and having an upper surface spaced from the semiconductor body, (4) a partially deformable fluorocarbon thrust member which is permanently deformed under pressure disposed adjacent the semiconductor element and said upper surface of said electrical contact, and means for applying a constant force to the thrust member to maintain the semiconductor element and the support member in an electrically and thermally conductive relationship with each other, said force being of a value to permanently deform said thrust member so that said thrust member is in flush pressure contact with said semiconductor body and said upper surface of said electrical contact.

2. The compression bonded electrical device of claim 1 in which the material comprising the partially deformable thrust member is polytetrafluoroethylene.

3. The compression bonded electrical device of claim 1 in which the material comprising the partially deformable thrust member is trifluoromonochloroethylene.

4. The compression bonded electrical device of claim 1, in which the semiconductor element is enclosed within a hermetic enclosure.

5. The compression bonded electrical device of claim 1, in which the semiconductor element is enclosed within a hermetic enclosure, an electrically and thermally conductive contact member is disposed between, and in contact with, the support member and the semiconductor element, and in which the material comprising the partially deformable thrust member is polytetrafluoroethylene.

References Cited

UNITED STATES PATENTS

| | | | |
|---|---|---|---|
| 2,734,102 | 2/1956 | Pankove | 179—171 |
| 3,057,952 | 10/1962 | Gordon | 174—110.6 |
| 3,059,157 | 10/1962 | English et al. | 317—234 |
| 3,107,197 | 10/1963 | Stein et al. | 161—189 |
| 3,192,454 | 6/1965 | Rosenheinrich et al. | 317—234 |

JOHN W. HUCKERT, Primary Examiner

J. R. SHEWMAKER, Assistant Examiner

U.S. Cl. X.R.

317—235